(12) United States Patent
Sunwoo et al.

(10) Patent No.: US 11,764,901 B2
(45) Date of Patent: Sep. 19, 2023

(54) APPARATUS AND METHOD FOR SUCCESSIVE CANCELLATION FLIP DECODING OF POLAR CODE

(71) Applicant: AJOU UNIVERSITY INDUSTRY—ACADEMIC COOPERATION FOUNDATION, Suwon-si (KR)

(72) Inventors: Myung Hoon Sunwoo, Seoul (KR); Jae Hong Roh, Suwon-si (KR); U Seok Lee, Suwon-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 0 days.

(21) Appl. No.: 17/717,766

(22) Filed: Apr. 11, 2022

(65) Prior Publication Data

US 2022/0329350 A1    Oct. 13, 2022

(30) Foreign Application Priority Data

Apr. 12, 2021    (KR) .................. 10-2021-0047101

(51) Int. Cl.
*H04L 1/00*      (2006.01)
*H03M 13/11*     (2006.01)
*H03M 13/00*     (2006.01)

(52) U.S. Cl.
CPC ....... *H04L 1/0057* (2013.01); *H03M 13/1105* (2013.01); *H04L 1/0045* (2013.01)

(58) Field of Classification Search
CPC . H04L 1/0057; H04L 1/0045; H03M 13/1105
See application file for complete search history.

(56) References Cited

U.S. PATENT DOCUMENTS 11,463,114 B2 * 10/2022 Koike-Akino ...... G06F 13/4027
2021/0157672 A1 * 5/2021 Seol .................... G06F 11/1048

FOREIGN PATENT DOCUMENTS

KR    10-2115216 B1    5/2020

* cited by examiner

*Primary Examiner* — Justin R Knapp
(74) *Attorney, Agent, or Firm* — Sughrue Mion, PLLC (57) ABSTRACT

Disclosed are an apparatus and method for successive cancellation flip decoding of a polar code. The apparatus for successive cancellation flip decoding of a polar code according to an embodiment includes an iterative unit subtotal matrix generator configured to generate an iterative unit subtotal matrix corresponding to a preset iterative unit size based on a portion of an entire subtotal matrix, a selection logic configured to determine one or more selection bits based on a bit string representing a position of a bit returned when re-decoding and generate an auxiliary matrix for generating the entire subtotal matrix from the one or more selection bits, and an entire subtotal matrix generator configured to generate the entire subtotal matrix by using the iterative unit subtotal matrix and the auxiliary matrix.

12 Claims, 9 Drawing Sheets

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 1 | 1 | 1 | 1 | 1 | 1 | 1 | 1 | 1 | 1 | 1 | 1 | 1 | 1 | 1 | 1 |
| 1 | 0 | 1 | 0 | 1 | 0 | 1 | 0 | 1 | 0 | 1 | 0 | 1 | 0 | 1 | 0 | 1 |
| 2 | 0 | 0 | 1 | 1 | 0 | 0 | 1 | 1 | 0 | 0 | 1 | 1 | 0 | 0 | 1 | 1 |
| 3 | 0 | 0 | 0 | 1 | 0 | 0 | 0 | 1 | 0 | 0 | 0 | 1 | 0 | 0 | 0 | 1 |
| 4 | 0 | 0 | 0 | 0 | 1 | 1 | 1 | 1 | 0 | 0 | 0 | 0 | 1 | 1 | 1 | 1 |
| 5 | 0 | 0 | 0 | 0 | 0 | 1 | 0 | 1 | 0 | 0 | 0 | 0 | 0 | 1 | 0 | 1 |
| 6 | 0 | 0 | 0 | 0 | 0 | 0 | 1 | 1 | 0 | 0 | 0 | 0 | 0 | 0 | 0 | 0 |
| 7 | 0 | 0 | 0 | 0 | 0 | 0 | 0 | 1 | 0 | 0 | 0 | 0 | 0 | 0 | 0 | 1 |
| 8 | 0 | 0 | 0 | 0 | 0 | 0 | 0 | 0 | 1 | 1 | 1 | 1 | 1 | 1 | 1 | 1 |
| 9 | 0 | 0 | 0 | 0 | 0 | 0 | 0 | 0 | 0 | 1 | 0 | 1 | 0 | 1 | 0 | 1 |
| 10 | 0 | 0 | 0 | 0 | 0 | 0 | 0 | 0 | 0 | 0 | 1 | 1 | 0 | 0 | 1 | 1 |
| 11 | 0 | 0 | 0 | 0 | 0 | 0 | 0 | 0 | 0 | 0 | 0 | 1 | 0 | 0 | 0 | 1 |
| 12 | 0 | 0 | 0 | 0 | 0 | 0 | 0 | 0 | 0 | 0 | 0 | 0 | 1 | 1 | 1 | 1 |
| 13 | 0 | 0 | 0 | 0 | 0 | 0 | 0 | 0 | 0 | 0 | 0 | 0 | 0 | 1 | 0 | 1 |
| 14 | 0 | 0 | 0 | 0 | 0 | 0 | 0 | 0 | 0 | 0 | 0 | 0 | 0 | 0 | 1 | 1 |
| 15 | 0 | 0 | 0 | 0 | 0 | 0 | 0 | 0 | 0 | 0 | 0 | 0 | 0 | 0 | 0 | 1 |

$$\begin{bmatrix} \text{ENTIRE} \\ \text{SUBTOTAL} \\ \text{MATRIX} \end{bmatrix} = \begin{bmatrix} 1 & 1 \\ 0 & 1 \end{bmatrix}^{\otimes 9}$$

$$= \begin{bmatrix} 1 & 1 \\ 0 & 1 \end{bmatrix}^{\otimes 4} \otimes \begin{bmatrix} \text{ITERATIVE} \\ \text{UNIT SUBTOTAL} \\ \text{MATRIX} \end{bmatrix}$$

$$\begin{bmatrix} \text{ITERATIVE} \\ \text{UNIT SUBTOTAL} \\ \text{MATRIX} \end{bmatrix} = \begin{bmatrix} 1 & 1 & 1 & 1 \\ 0 & 1 & 0 & 1 \\ 0 & 0 & 1 & 1 \\ 0 & 0 & 0 & 1 \end{bmatrix} \otimes \begin{bmatrix} 1 & 1 & 1 & 1 \\ 0 & 1 & 0 & 1 \\ 0 & 0 & 1 & 1 \\ 0 & 0 & 0 & 1 \end{bmatrix} \otimes \begin{bmatrix} \text{ITERATIVE} \\ \text{UNIT SUBTOTAL} \\ \text{MATRIX} \end{bmatrix}$$

500 —

$N=1024$, $M=32$, $\otimes$ KRONECKER PRODUCT

APPARATUS AND METHOD FOR SUCCESSIVE CANCELLATION FLIP DECODING OF POLAR CODE

CROSS-REFERENCE TO RELATED APPLICATION

This application claims the benefit under 35 USC § 119(a) of Korean Patent Application No. 10-2021-0047101, filed on Apr. 12, 2021, in the Korean Intellectual Property Office, the entire disclosure of which is incorporated herein by reference for all purposes.

BACKGROUND

1. Field

The disclosed embodiments relate to a technique for decoding a polar code based on a successive cancellation flip (SCF) decoding method.

2. Description of Related Art

The polar code is a linear block code that appeared in 2009 and is the first error correction code that achieves a channel capacity defined according to the Shannon's theory. The polar code has been recognized for its excellence and has been adopted as a channel code for the 5G standard, and research on the polar code is being actively conducted. The polar code has an advantage of showing low complexity in encoding and decoding, but the successive-cancellation (SC) (hereinafter referred to as SC) decoding, which is the most basic decoding scheme for the polar code, has lower error correction performance compared to the SC decoding for the low-density parity-check (LDPC) code and the turbo code, which are other error correction codes currently used.

In order to solve this shortcoming, supplementary decoding schemes based on the SC decoding scheme have been proposed, and one of them is a successive cancellation flip (SCF) (hereinafter, SCF) decoding scheme. This SCF decoding scheme is performed through a bit-flipping algorithm that changes a value of a bit, which has a high probability of error due to low reliability of a codeword. A cyclic redundancy check (CRC) (hereinafter referred to as CRC) code is additionally used. to determine whether or not the corresponding process is in progress.

The SCF decoding process is as follows. When primary decoding using a conventional SC decoding scheme is completed, error detection is performed through the CRC code. In this case, if an error is not detected, decoding is terminated. If an error is detected, the SCF decoding process returns to a position of the bit having the lowest log-likelihood ratio (LLR) (hereinafter, LLR) value and flips the corresponding bit. After that, re-decoding is performed at the corresponding position, and CRC detection is performed again when the re-decoding is completed. Even if bit flipping is performed, if an error is detected again in the secondary CRC detection, the SCF decoding process flips the bit having the second LLR minimum value and returns to the corresponding position. This process is repeated up to T times.

Although the SCF decoding scheme has improved low error correction performance of the conventional SC decoding method, memory usage is greatly increased when implemented by hardware. In the SC decoding scheme, the codeword is sequentially decoded bit by bit, and information such as LLR and subtotal at the previous bit position is used when decoding the next bit. The SCF decoder based on this SC decoding scheme has to store information at the corresponding position up to T times due to the process by which the SCF decoder returns to the previous bit when an error is detected. Accordingly, an additional memory is required to store pieces of information at the corresponding positions, and thus the memory usage and power consumption of the entire decoder increase. In order to solve the hardware implementation problem of the SCF decoder, there is a need for a memory reduction technique through an efficient decoder structure.

PRIOR ART LITERATURE

Patent Literature

PTL 1: Korea Patent Publication No. 10-2115216 (Registered on May 20, 2020)

SUMMARY

The disclosed embodiments are to provide an apparatus and method for successive cancellation flip decoding of a polar code.

According to an aspect of the present disclosure, there is provided an apparatus for successive cancellation flip decoding of a polar code, including an iterative unit subtotal matrix generator configured to generate an iterative unit subtotal matrix corresponding to a preset iterative unit size based on a portion of an entire subtotal matrix, a selection logic configured to determine one or more selection bits based on a bit string representing a position of a bit returned when re-decoding and generate an auxiliary matrix for generating the entire subtotal matrix from the one or more selection bits, and an entire subtotal matrix generator configured to generate the entire subtotal matrix by using the iterative unit subtotal matrix and the auxiliary matrix.

The iterative unit subtotal matrix generator may be configured to generate the iterative unit subtotal matrix having a size smaller than a size of the entire subtotal matrix.

The iterative unit subtotal matrix generator may be configured to generate the iterative unit subtotal matrix based on a fractal structure of the entire subtotal matrix.

In the bit string, a position of the bit returned may be expressed in a binary system.

The selection logic may be configured to determine the one or more selection bits based on one or more bits among the remaining bits excluding bits from a least significant bit (LSB) to a bit of a higher digit by the number set based on the preset iterative unit size in a plurality of bits included in the bit string.

The selection logic may be configured to determine the one or more selection bits by excluding a most significant bit (MSB) of the bit string from among the remaining one or more bits.

The selection logic may be configured to generate the auxiliary matrix by substituting the one or more selection bits into a preset operation relation between the one or more selection bits.

The selection logic may be configured to generate one or more selection bit vectors based on the preset operation relation, and generate each column of the auxiliary matrix in ascending order of the columns by substituting the one or more selection bits into the one or more selection bit vectors.

The selection logic may be configured to generate the auxiliary matrix by connecting the preset operation relation with an AND gate between the one or more selection bits.

According to another aspect of the present disclosure, there is provided a method for successive cancellation flip decoding of a polar code, including generating an iterative unit subtotal matrix corresponding to a preset iterative unit size based on a portion of an entire subtotal matrix, determining one or more selection bits based on a bit string representing a position of a bit returned when re-decoding, generating an auxiliary matrix for generating the entire subtotal matrix from the one or more selection bits, and generating the entire subtotal matrix by using the iterative unit subtotal matrix and the auxiliary matrix.

In the generating of the iterative unit subtotal matrix, the iterative unit subtotal matrix having a size smaller than a size of the entire subtotal matrix may be generated.

In the generating of the iterative unit subtotal matrix, the iterative unit subtotal matrix may be generated based on a fractal structure of the entire subtotal matrix.

In the bit string, a position of the bit returned may be expressed in a binary system.

In the determining of the one or more selection bits the one or more selection bits may be determined based on one or more bits among the remaining bits excluding bits from a least significant bit (LSB) to a bit of a higher digit by the number set based on the preset iterative unit size in a plurality of bits included in the bit string.

In the determining of the one or more selection bits, the one or more selection bits may be determined by excluding a most significant bit (MSB) of the bit string from among the remaining one or more bits.

In the generating of the auxiliary matrix, the auxiliary matrix may be generated by substituting the one or more selection bits into a preset operation relation between the one or more selection bits.

In the generating of the auxiliary matrix, one or more selection bit vectors may be generated based on the preset operation relation, and each column of the auxiliary matrix in ascending order of the columns may be generated by substituting the one or more selection bits into the one or more selection bit vectors.

In the generating of the auxiliary matrix, the auxiliary matrix may be generated by connecting the preset operation relation with an AND gate between the one or more selection bits.

According to the disclosed embodiments, it is possible to reduce the memory usage required for decoding using the successive cancellation flip (SCF) decoding method by using the iterative unit subtotal matrix.

According to the disclosed embodiments, since the selection logic uses an AND gate in generating the entire subtotal matrix, it is possible to reduce an area of a matrix generator used in the SCF-based decoding device and provide high throughput at the same time.

DETAILED DESCRIPTION

Hereinafter, a specific embodiment of exemplary embodiments will be described with reference to the drawings. The following detailed description is provided to aid in a comprehensive understanding of the methods, apparatus and/or systems described herein. However, this is illustrative only, and the present disclosure is not limited thereto.

In describing the embodiments, when it is determined that a detailed description of related known technologies related to the present disclosure may unnecessarily obscure the subject matter of the present disclosure, a detailed description thereof will be omitted. In addition, terms to be described later are terms defined in consideration of functions in the present disclosure, which may vary according to the intention or custom of users or operators. Therefore, the definition should be made based on the contents throughout this specification. The terms used in the detailed description are only for describing embodiments, and should not be limiting. Unless explicitly used otherwise, expressions in the singular form include the meaning of the plural form. In this description, expressions such as "comprising" or "including" are intended to refer to certain features, numbers, steps, actions, elements, some or combination thereof, and it is not to be construed to exclude the presence or possibility of one or more other features, numbers, steps, actions, elements, some or combinations thereof, other than those described.

Figure 1:
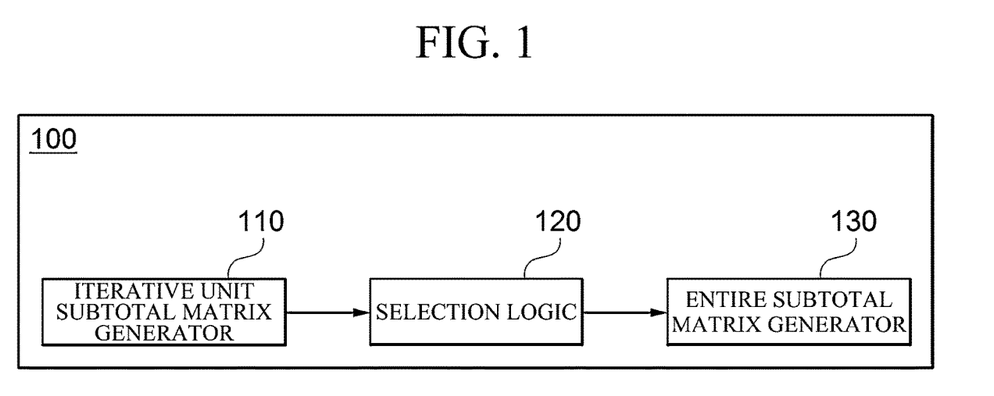
FIG. 1 is a block diagram for describing an apparatus for successive cancellation flip decoding of a polar code according to an embodiment.

FIG. 1 is a block diagram for describing an apparatus 100 for successive cancellation flip decoding of a polar code according to an embodiment.

Referring to FIG. 1, the apparatus 100 for successive cancellation flip decoding of the polar code according to an embodiment includes an iterative unit subtotal matrix generator 110, a selection logic 120, and an entire subtotal matrix generator 130.

In the following embodiments, each configuration may have different functions and capabilities other than those described below, and may include additional configurations other than those not described below.

In addition, in the following embodiments, the iterative unit subtotal matrix generator 110, the selection logic 120, and the entire subtotal matrix generator 130 may be implemented using one or more physically separated devices, or may be implemented by one or more processors or a combination of one or more processors and software, and may not be clearly distinguished in specific operation unlike the illustrated example.

The iterative unit subtotal matrix generator 110 generates an iterative unit subtotal matrix corresponding to a preset iterative unit size M based on a portion of the entire subtotal matrix.

In this case, the entire subtotal matrix means a subtotal matrix used in a successive cancellation bit inversion (SCF) (hereinafter, SCF) decoding process, and means a matrix including, as each column, a bit string output from a matrix generator of an SCF-based decoder when a codeword is decoded bit by bit by the successive cancellation (hereinafter, SC) scheme. According to an embodiment, the entire subtotal matrix may be a matrix having a size of N/2×N/2 based on a code length N of the codeword to be decoded.

The iterative unit subtotal matrix means a matrix generated by being inferred from a portion of the entire subtotal matrix, and means a matrix required to generate the entire subtotal matrix.

The iterative unit subtotal matrix generator 110 generates an iterative unit subtotal matrix based on a portion of the entire subtotal matrix, and thus may generate an iterative unit subtotal matrix having a size smaller than the size of the entire subtotal matrix.

In this case, the size of the iterative unit subtotal matrix may be determined by a preset iterative unit size M.

In addition, the iterative unit subtotal matrix generator 110 may generate an iterative unit subtotal matrix based on a portion having self-similar characteristics of the entire subtotal matrix, and may generate the iterative unit subtotal matrix based on a fractal structure included in the entire subtotal matrix.

The selection logic 120 determines one or more selection bits based on a bit string representing a position of a bit to which the SCF decoder returns when re-decoding, and generates an auxiliary matrix for generating an entire subtotal matrix from the one or more selection bits.

The entire subtotal matrix generator 130 generates the entire subtotal matrix by using the iterative unit subtotal matrix and the auxiliary matrix.

Meanwhile, since the matrix generator of the conventional SCF decoder cannot calculate a subtotal matrix for a previous decoding time, a general SCF decoder requires additional memory for storing the subtotal matrix.

On the other hand, the apparatus 100 for successive cancellation flip decoding of the polar code according to an embodiment stores may save and use the iterative unit subtotal matrix corresponding to a portion of the entire subtotal matrix, thereby exhibiting an effect of reducing the additional memory usage required in a decoding process.

Figure 2:
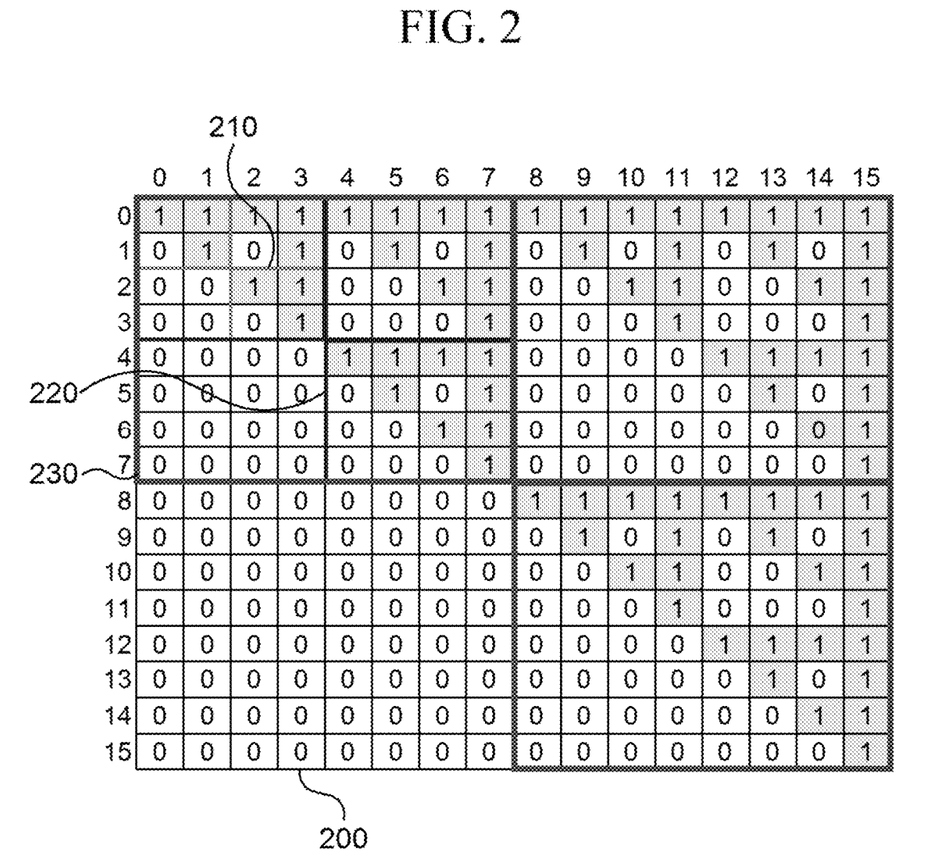
FIG. 2 is an exemplary diagram for describing a process of generating an iterative unit subtotal matrix according to an embodiment.

FIG. 2 is an exemplary diagram for describing a process of generating the iterative unit subtotal matrix according to an embodiment.

In the example illustrated in FIG. 2, for convenience of explanation, it is assumed that a code length N of the codeword is 32 and thus the size of the entire subtotal matrix 200 is 16×16, but the code length N of the codeword and the size of the entire subtotal matrix 200 may be changed according to embodiments.

Referring to FIG. 2, the entire subtotal matrix 200 is formed of a Kronecker product, and the entire subtotal matrix 200 has a fractal structure.

Specifically, in the example illustrated, the entire subtotal matrix 200 includes three first fractals 210 with a size of 2×2, three second fractals 220 with a size of 4×4, and three third fractals 230 with a size of 8×8.

That is, the generator 110 may generate the iterative unit subtotal matrix corresponding to one of sizes of 2×2, 4×4, and 8×8 based on at least one of the first fractal 210, the second fractal 220, and the third fractal 230.

As such, the iterative unit subtotal matrix generator 110 may generate the iterative unit subtotal matrix by inferring a portion of the entire subtotal matrix based on the self-similar characteristics of the entire subtotal matrix 200.

Figure 3:
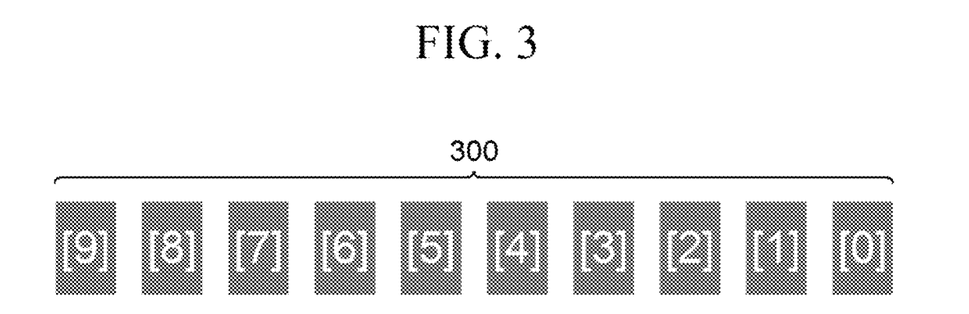
FIG. 3 is an exemplary diagram for describing a bit string representing a position of a bit returned when re-decoding according to an embodiment.

FIG. 3 is an exemplary diagram for describing a bit string 300 representing a position of a bit returned when re-decoding according to an embodiment.

Referring to FIG. 3, the length of the bit string 300 may be determined according to the code length N of the code word. For example, when the code length N of the code word is 1024, the bit string 300 may be the bit string 300 having a length of 10 as in the example illustrated in FIG. 3.

In the example illustrated in FIG. 3, a number in square brackets [ ]' indicates an index of each bit in the bit string 300.

Meanwhile, in the bit string 300, the position of the bit returned when re-decoding among the bits of the codeword may be expressed in a binary system.

For example, when the code length N of a codeword expressed as a decimal number is N-bit, the position of the bit returned when re-decoding may be specified by being expressed with the bit string 300 having the length of $\log_2 N$ bits.

As a specific example, when the bit to be re-decoded is a bit decoded first based on the SC decoding scheme, in this case, the position of the corresponding bit expressed based on the bit string 300 may be expressed as 0000000000.

As another example, when the bit to be re-decoded is a bit decoded 1024-th based on the SC decoding scheme, in this case, the position of the corresponding bit expressed based on the bit string 300 may be expressed as 1111111111.

Figure 4:
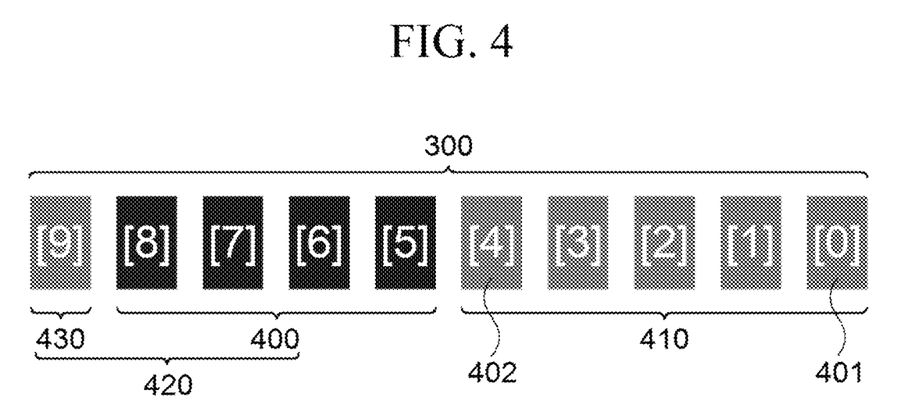
FIG. 4 is an exemplary diagram for describing a process of determining one or more selection bits according to an embodiment.

FIG. 4 is an exemplary diagram for describing a process of determining one or more selection bits 400 according to an embodiment.

The selection logic 120 may determine the one or more selection bits 400 based on the bit string 300. In this case, the one or more selection bits 400 refer to bits for generating each column of the auxiliary matrix.

Specifically, a process in which the selection logic 120 determines the one or more selection bits 400 is as follows.

According to one embodiment, the selection logic 120 may determine one or more selection bits 400 based on the remaining bits 420 excluding bits 410 from a least significant bit (LSB) 401 a bit 402 of a higher digit by the number set based on the preset iterative unit size M in a plurality of bits included in the bit string 300.

In other words, when the sign length N of the codeword is N and the preset iterative unit size M is M, the selection logic 120 may determine one or more selection bits 400 based on the remaining bits 420 excluding the bits 410 from the least significant bit 401 to the bit 402 of a higher digit by $\log_2 M$ bits among the bit string 300 including $\log_2 M$ bits.

Specifically, assuming that the code length N of the codeword is 1024 and the preset iterative unit size M is 32, the selection logic 120 may determine the one or more selection bits 400 based on the remaining bits 420 excluding the bits 410 from the least significant bit 401 corresponding to the bit index [0] to the bit 402 of a higher digit corresponding to the bit index [4].

Meanwhile, when the code length N of the codeword is N, the column length of the entire subtotal matrix is N/2, and the cycle of the subtotal matrix is generated by repeating a total of two times. Accordingly, the most significant bit 401 of the bit string 300 does not need to be considered in determining one or more selection bits 400.

As a result, the selection logic 120 according to an embodiment may determine one or more selection bits 400 by excluding the most significant bit 430 from among the remaining bits 420.

Specifically, with reference to FIG. 4, for example, the selection logic 120 may determine one or more bits corresponding to the bit indexes [5] to [8] as one or more selection bits 400 by excluding the most significant bit 430 corresponding to the bit index [9] among the remaining bits 420 corresponding to the bit indexes [5] to [9].

After all, when the bit string indicating the position of the bit to which an SCF decoder returns when re-decoding under the condition described above is 00000000000, the selection logic 120 may determine the one or more selection bits 400 as 0000. As another example, when the bit string indicating the position of the bit to which an SCF decoder returns when re-decoding corresponds to 1111111111, the selection logic 120 may determine the one or more selection bits as 1111.

Figure 5:
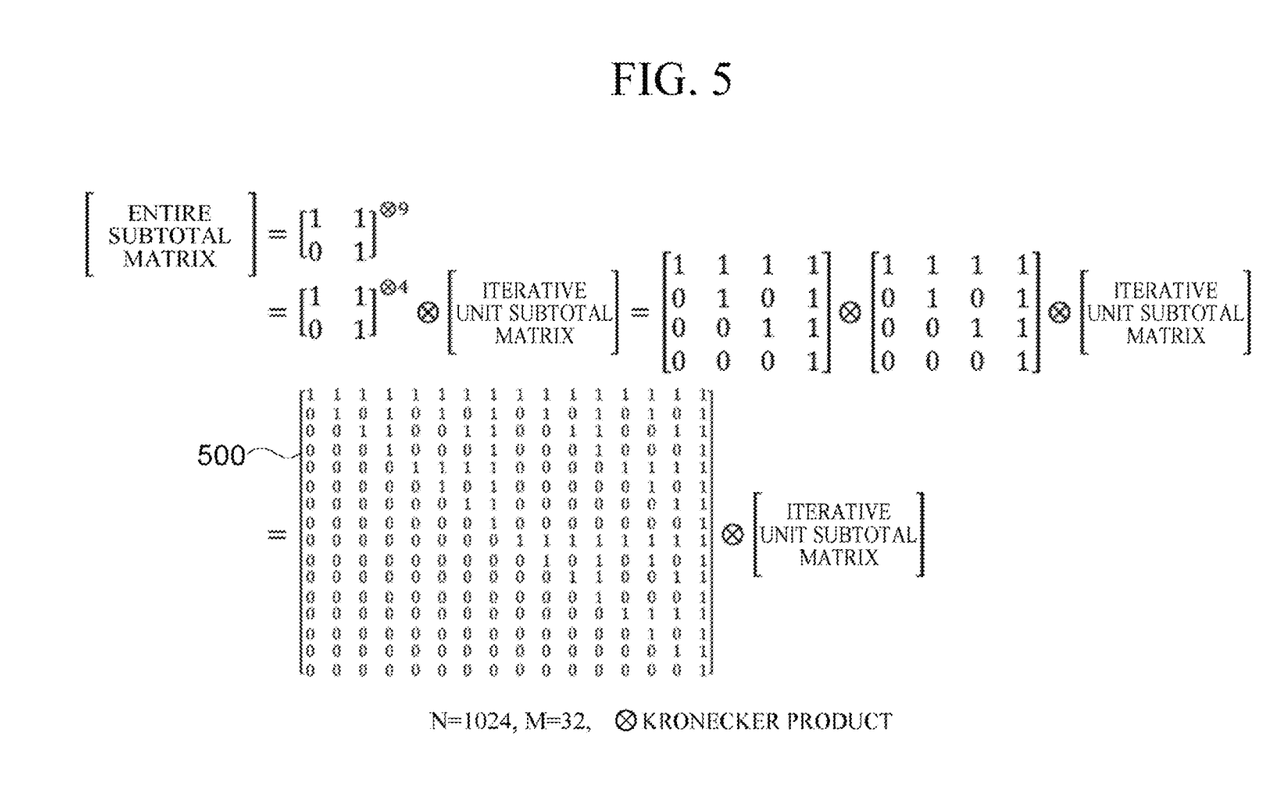
FIG. 5 is an exemplary diagram for describing a relationship between an entire subtotal matrix, the iterative unit subtotal matrix, and an auxiliary matrix according to an embodiment.

FIG. 5 is an exemplary diagram for describing the relationship between the entire subtotal matrix, the iterative unit subtotal matrix, and the auxiliary matrix 500.

When the length of the column of the entire subtotal matrix is N/2 bits and the preset iterative unit size M is M bits, the entire subtotal matrix generator 130 may generate the entire subtotal matrix having a size of N/2×N/2 by taking the Kronecker product of the iterative unit subtotal matrix of size M× and the auxiliary matrix 500 of (N/M/2)×(N/M/2) size.

For example, when the preset iterative unit size is 32 and the column length of the entire subtotal matrix is 512 as illustrated in FIG. 5, the entire subtotal matrix generator 130 may generate the entire subtotal matrix having a size of 512×512 by taking the Kronecker product of the iterative unit subtotal matrix having a size of 32×32 and the auxiliary matrix 500 having a size of 16×16.

Figure 6:
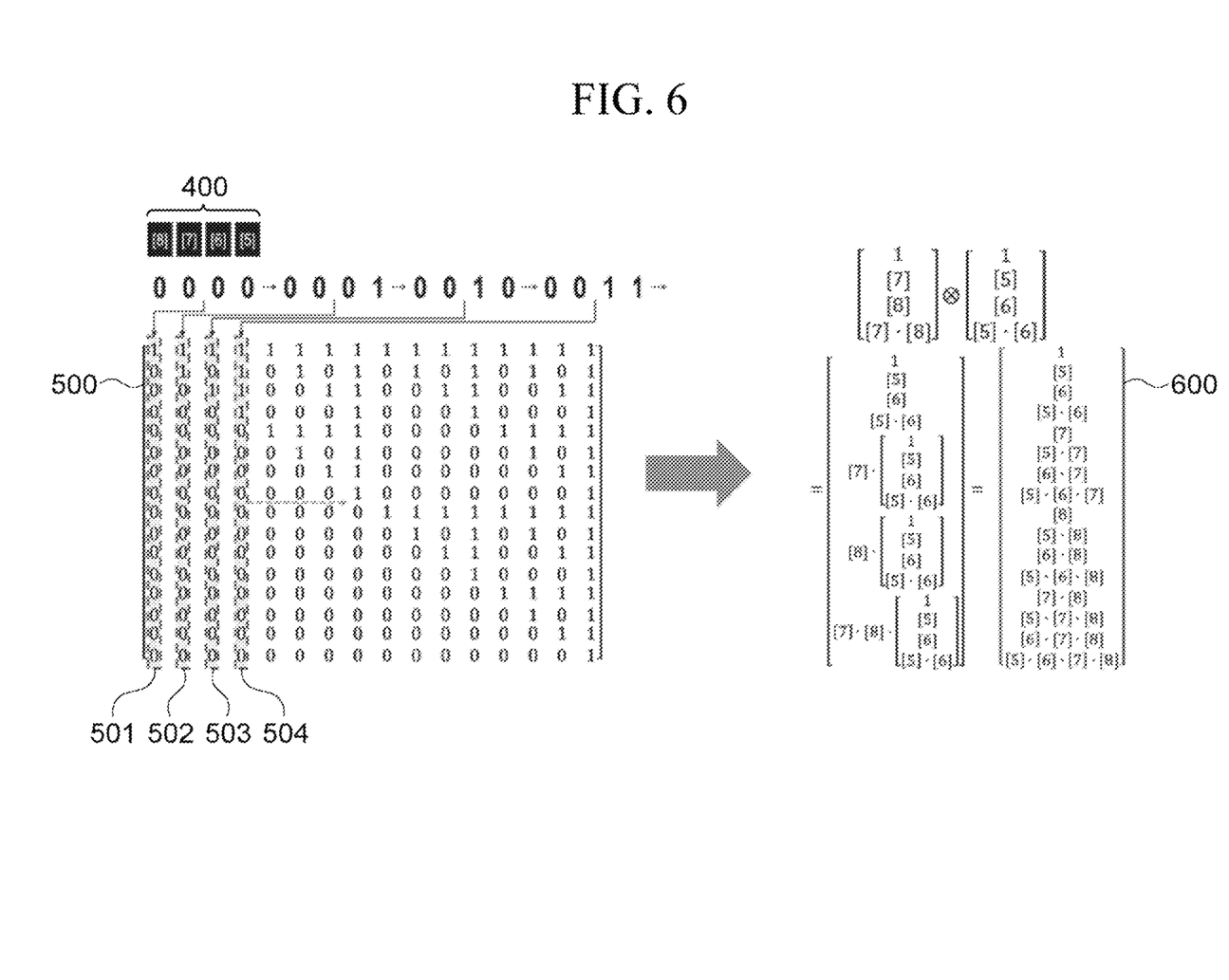
FIG. 6 is a diagram for describing a process of generating the auxiliary matrix based on one or more selection bits according to an embodiment.

FIG. 6 is a diagram for describing a process of generating the auxiliary matrix 500 based on the one or more selection bits 400.

Referring to FIG. 6, the auxiliary matrix 500, which has a size of 16×16 when the code length N of the codeword is 1024 and the preset iterative unit size M is 32, is illustrated.

In this case, each column of the auxiliary matrix 500 may be generated through the one or more selection bits 400.

For example, when the one or more selection bits 400 are determined to be 0000, the first column of the auxiliary matrix 500 may be generated like a column 501.

For example, when the one or more selection bits 400 are determined to be 0001, the second column of the auxiliary matrix 500 may be generated like a column 502.

For example, when one or more selection bits 400 are determined to be 0010, the third column of the auxiliary matrix 500 may be generated like a column 503.

For example, when one or more selection bits 400 are determined to be 0011, the fourth column of the auxiliary matrix 500 may be generated like a column 504.

The auxiliary matrix 500 may be generated through the one or more selection bits 400 depending on the iterative unit subtotal matrix and the entire subtotal matrix, and the selection logic 120 may generate each column of the auxiliary matrix 500 in ascending order of the columns based on a selection bit vector 600 formed of a combination of the one or more selection bits 400.

In this case, the selection bit vector 600 is a vector expressing information on whether or not the iterative unit subtotal matrix is iterated due to the Kronecker product with the iterative unit subtotal matrix.

In this case, the selection bit vector 600 includes an element obtained by forming one or more selection bits 400 in a preset operation relation as an element in the selection bit vector.

Figure 7:
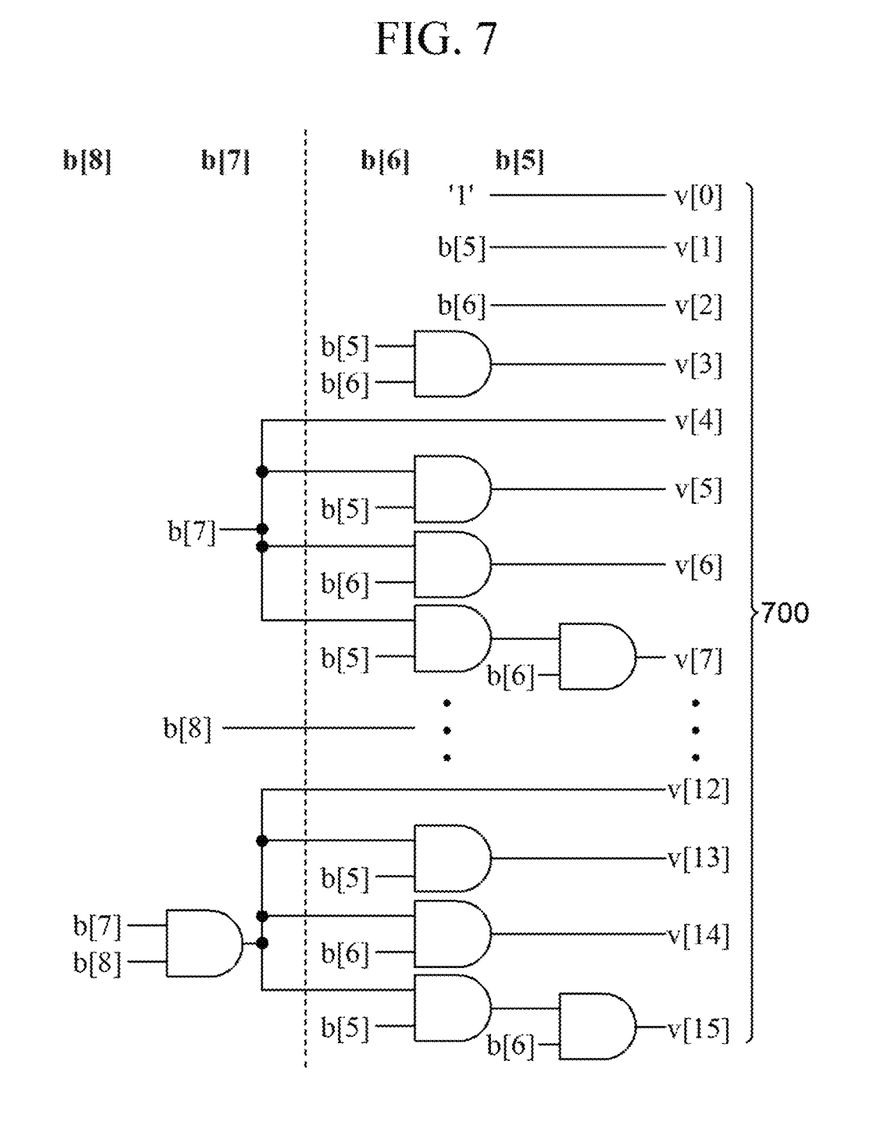
FIG. 7 is a diagram illustrating a preset operation relation as an AND gate between one or more selection bits according to an embodiment.

FIG. 7 is a diagram illustrating a preset operation relation as an AND gate between the one or more selection bits 400.

As illustrated in FIG. 7, the selection logic 120 may reduce an area it occupies compared to an area occupied by the matrix generator of the prior art, through a logic structure in which one or more selection bits are connected by the logical product operator based on the preset operation relation.

The conventional entire subtotal matrix generator outputs each column of the entire subtotal matrix using a flip-flops and an exclusive OR (XOR) operator.

On the other hand, the entire subtotal matrix generator 130 according to an embodiment may generate the entire subtotal matrix by using the AND operator in place of the flip-flop and the exclusive OR operator.

In this case, when considering that the logical product operator has a smaller area occupancy rate compared to the flip-flops and the exclusive-OR operator, the apparatus 100 for successive cancellation flip decoding of the polar code according to an embodiment may provide an apparatus for successive cancellation flip decoding of the polar code having a smaller area compared to the prior art.

Figure 8A:
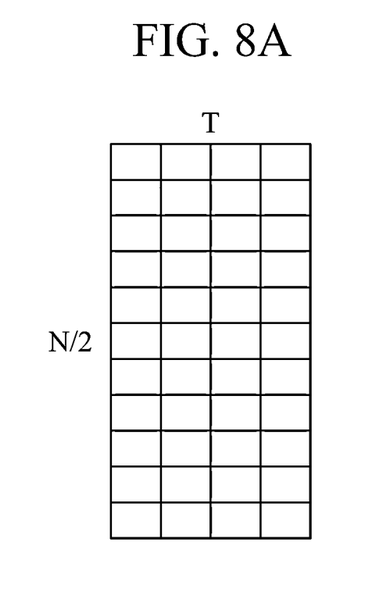
FIGS. 8A and 8B are diagrams illustrating the memory usage of the apparatus for successive cancellation flip decoding of a polar code according to an embodiment compared to the prior art.
Figure 8B:
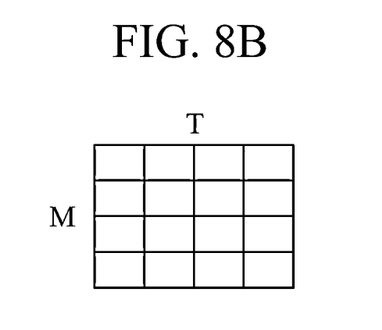

FIGS. 8A and 8B are diagrams illustrating the memory usage of the apparatus for successive cancellation flip decoding of the polar code according to an embodiment compared to the prior art.

Referring to FIG. 8A, when the maximum number of times of re-decoding is T and the code length N of the codeword is N, a conventional apparatus for successive cancellation flip decoding of a polar code requires an additional subtotal memory for T*N/2 bits.

On the other hand, referring to FIG. 8B, when the size of the preset iterative unit subtotal matrix is M bits, the apparatus 100 for successive cancellation flip decoding of the polar code according to an embodiment may reduce the additional subtotal memory usage to T*M bits by removing the influence on the code length N of the codeword.

As a specific example, when N, M, and T are 1024, 32, and 8, respectively, the conventional apparatus for successive cancellation flip decoding of the polar code requires an additional subtotal memory for 4096 bits.

On the other hand, the apparatus 100 for successive cancellation flip decoding of the polar code according to an embodiment requires only the additional subtotal memory for 256 bits. That is, the apparatus 100 for successive cancellation flip decoding of the polar code according to an embodiment can reduce memory usage by 94% compared to the prior art.

After all, the apparatus 100 for successive cancellation flip decoding of the polar code according to an embodiment can reduce the subtotal memory usage compared to the prior art by using the iterative unit subtotal matrix.

Figure 9:
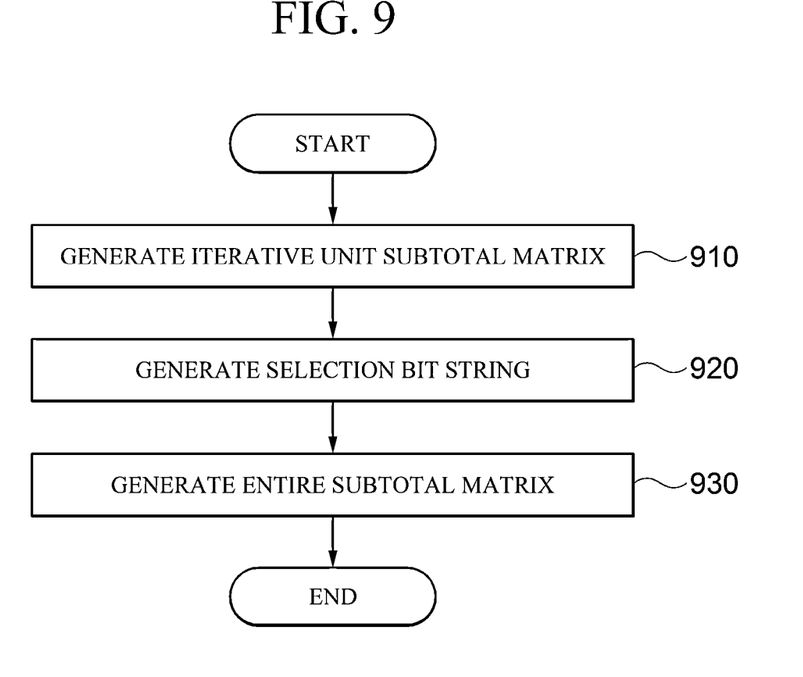
FIG. 9 is a flowchart for describing a method for successive cancellation flip decoding of a polar code according to an embodiment.

FIG. 9 is a flowchart for describing a method for successive cancellation flip decoding of the polar code according to an embodiment.

The method illustrated in FIG. 9 may be performed by the apparatus 100 for successive cancellation flip decoding of the polar code illustrated in FIG. 1.

Referring to FIG. 9, the apparatus 100 for successive cancellation flip decoding of the polar code generates the iterative unit subtotal matrix corresponding to the preset iterative unit size M based on a portion of the entire subtotal matrix. After that, the apparatus 100 for successive cancellation flip decoding of the polar code determines the one or more selection bits 400 based on a bit index expressing a position of a bit returned when re-decoding.

After that, the apparatus 100 for successive cancellation flip decoding of the polar code generates the auxiliary matrix 500 for generating the entire subtotal matrix from the one or more selection bits.

After that, the apparatus 100 for successive cancellation flip decoding of the polar code generates the entire subtotal matrix by using the iterative unit subtotal matrix and the auxiliary matrix 500.

In FIG. 9 illustrated above, although the method has been described by dividing the method into a plurality of steps, at least some steps may be performed in a different order, may be performed together in combination with other steps, omitted, performed by being divided into sub-steps, or performed by being added with one or more steps not illustrated.

Figure 10:
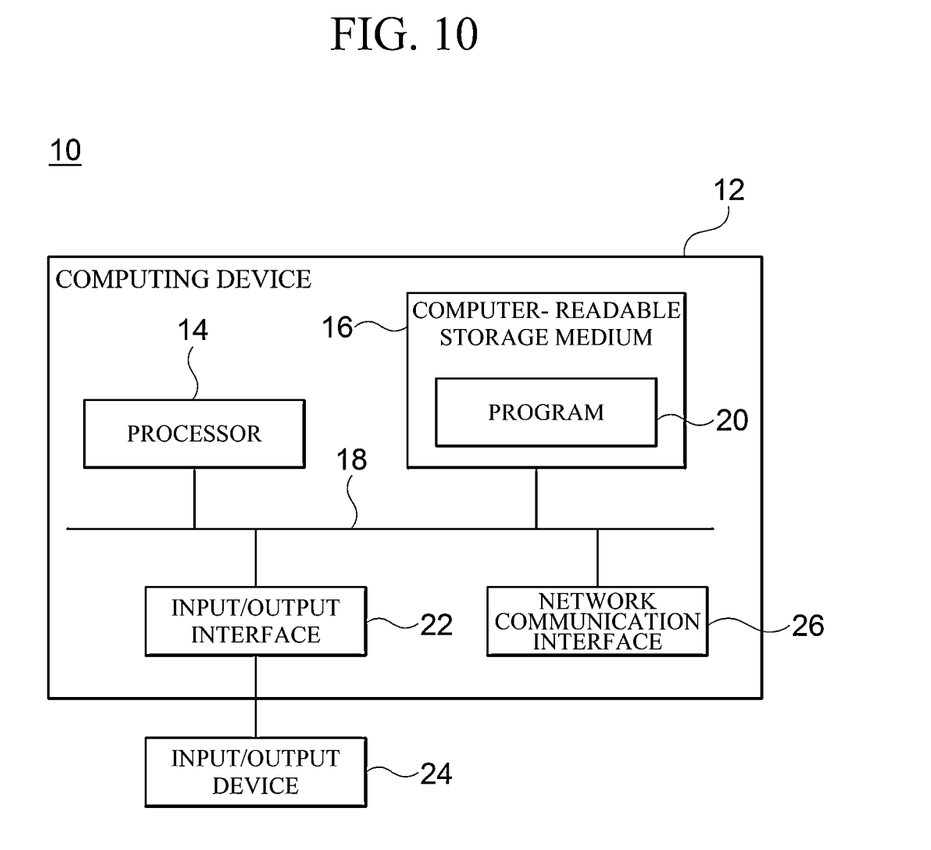
FIG. 10 is a block diagram illustratively describing a computing environment including a computing device according to an embodiment.

FIG. 10 is a block diagram illustratively describing a computing environment 10 including a computing device suitable for use in exemplary embodiments.

In the illustrated embodiment, respective components may have different functions and capabilities other than those described below, and may include additional components in addition to those not described below.

The illustrated computing environment 10 includes a computing device 12. In an embodiment, the computing device 12 may be one or more components included in the apparatus 100 for successive cancellation flip decoding of the polar code.

The computing device 12 includes at least one processor 14, a computer-readable storage medium 16, and a communication bus 18. The processor 14 may cause the computing device 12 to operate according to the exemplary embodiment described above. For example, the processor 14 may execute one or more programs stored on the computer-readable storage medium 16. The one or more programs may include one or more computer-executable instructions, which, when executed by the processor 14, may be configured so that the computing device 12 performs operations according to the exemplary embodiment.

The computer-readable storage medium 16 is configured so that the computer-executable instruction or program code, program data, and/or other suitable forms of information are stored. A program 20 stored in the computer-readable storage medium 16 includes a set of instructions executable by the processor 14. In one embodiment, the computer-readable storage medium 16 may be a memory (volatile memory such as a random access memory, non-volatile memory, or any suitable combination thereof), one or more magnetic disk storage devices, optical disk storage devices, flash memory devices, other types of storage media that are accessible by the computing device 12 and capable of storing desired information, or any suitable combination thereof.

The communication bus 18 interconnects various other components of the computing device 12, including the processor 14 and the computer-readable storage medium 16.

The computing device 12 may also include one or more input/output interfaces 22 that provide an interface for one or more input/output devices 24, and one or more network communication interfaces 26. The input/output interface 22 and the network communication interface 26 are connected to the communication bus 18. The input/output device 24 may be connected to other components of the computing device 12 through the input/output interface 22. The exemplary input/output device 24 may include a pointing device (such as a mouse or trackpad), a keyboard, a touch input device (such as a touch pad or touch screen), a speech or sound input device, input devices such as various types of sensor devices and/or photographing devices, and/or output devices such as a display device, a printer, a speaker, and/or a network card. The exemplary input/output device 24 may be included inside the computing device 12 as a component constituting the computing device 12, or may be connected to the computing device 12 as a separate device distinct from the computing device 12.

Although representative embodiments of the present disclosure have been described in detail, those skilled in the art to which the present disclosure pertains will understand that various modifications may be made thereto within the limits that do not depart from the scope of the present disclosure. Therefore, the scope of rights of the present disclosure should not be limited to the described embodiments, but should be defined not only by claims set forth below but also by equivalents to the claims.

What is claimed is:

1. An apparatus for performing a successive cancellation flip (SCF) decoding of a polar code, the apparatus comprising:
   an iterative unit subtotal matrix generator configured to generate an iterative unit subtotal matrix corresponding to a preset iterative unit size based on a fractal structure of an entire subtotal matrix;
   a selection logic configured to determine selection bits based on a bit string representing a position of a bit returned when re-decoding a codeword of the polar code after performing a primary decoding of the codeword of the polar code and generate an auxiliary matrix for generating the entire subtotal matrix from the selection bits, the primary decoding including flipping of the bit;
   an entire subtotal matrix generator configured to generate the entire subtotal matrix by using the iterative unit subtotal matrix and the auxiliary matrix; and
   a memory configured to store the generated iterative unit subtotal matrix,
   wherein the selection logic is configured to include a plurality of AND gates and generate the auxiliary matrix through a logic structure of the plurality of AND gates formed by connecting the selection bits with the plurality of AND gates based on a preset operation relation.

2. The apparatus of claim 1, wherein
   the iterative unit subtotal matrix generator is configured to generate the iterative unit subtotal matrix having a size smaller than a size of the entire subtotal matrix.

3. The apparatus of claim 1, wherein
   in the bit string, a position of the bit returned is expressed in a binary system.

4. The apparatus of claim 1, wherein
   the selection logic is configured to determine the selection bits based on bits among remaining bits excluding bits from a least significant bit (LSB) to a bit of a higher digit by a number set based on the preset iterative unit size in a plurality of bits included in the bit string.

5. The apparatus of claim 4, wherein
   the selection logic is configured to determine the selection bits by excluding a most significant bit (MSB) of the bit string from among the remaining bits.

6. The apparatus of claim 1, wherein
the selection logic is configured to generate selection bit vectors based on the preset operation relation, and generate each column of the auxiliary matrix in ascending order of the columns by substituting the selection bits into the selection bit vectors.

7. A method for performing a successive cancellation flip (SCF) decoding of a polar code by an apparatus for performing the SCF decoding, the apparatus including an iterative unit, a selection logic, an entire subtotal matrix generator and a memory, the method comprising:
generating, by the iterative unit, an iterative unit subtotal matrix corresponding to a preset iterative unit size based on a fractal structure of an entire subtotal matrix;
determining, by the selection logic, selection bits based on a bit string representing a position of a bit returned when re-decoding a codeword of the polar code after performing a primary decoding of the codeword of the polar code, the primary decoding including flipping of the bit;
generating, by the selection logic, an auxiliary matrix for generating the entire subtotal matrix from the selection bits;
storing the generated iterative unit subtotal matrix in the memory; and
generating, by the entire subtotal matrix generator, the entire subtotal matrix by using the iterative unit subtotal matrix and the auxiliary matrix,
wherein the selection logic is configured to include a plurality of AND gates, and
wherein the generating of the auxiliary matrix comprises generating the auxiliary matrix through a logic structure of the plurality of AND gates formed by connecting the selection bits with the plurality of AND gates based on a preset operation relation.

8. The method of claim 7, wherein
in the generating of the iterative unit subtotal matrix, the iterative unit subtotal matrix having a size smaller than a size of the entire subtotal matrix is generated.

9. The method of claim 7, wherein
in the bit string, a position of the bit returned is expressed in a binary system.

10. The method of claim 7, wherein
in the determining of the selection bits,
the selection bits are determined based on bits among remaining bits excluding bits from a least significant bit (LSB) to a bit of a higher digit by a number set based on the preset iterative unit size in a plurality of bits included in the bit string.

11. The method of claim 10, wherein
in the determining of the selection bits, the selection bits are determined by excluding a most significant bit (MSB) of the bit string from among the remaining bits.

12. The method of claim 7, wherein
in the generating of the auxiliary matrix, selection bit vectors are generated based on the preset operation relation, and each column of the auxiliary matrix in ascending order of the columns is generated by substituting the selection bits into the selection bit vectors.

* * * * *